US011695030B2

(12) United States Patent
Mun

(10) Patent No.: US 11,695,030 B2
(45) Date of Patent: Jul. 4, 2023

(54) REDUCED CROSS-TALK PIXEL-ARRAY SUBSTRATE AND FABRICATION METHOD

(71) Applicant: OmniVision Technologies, Inc., Santa Clara, CA (US)

(72) Inventor: Seong Yeol Mun, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 267 days.

(21) Appl. No.: 17/138,711

(22) Filed: Dec. 30, 2020

(65) Prior Publication Data

US 2022/0208827 A1 Jun. 30, 2022

(51) Int. Cl.
*H01L 27/146* (2006.01)

(52) U.S. Cl.
CPC .. *H01L 27/14647* (2013.01); *H01L 27/14621* (2013.01); *H01L 27/14627* (2013.01); *H01L 27/14683* (2013.01)

(58) Field of Classification Search
CPC ......... H01L 27/14603; H01L 27/14638; H01L 27/14683; H01L 27/14621; H01L 27/14627; H01L 27/14647; H01L 27/1463; H01L 27/14643; H01L 27/14685
USPC .................................................... 250/208.1
See application file for complete search history.

(56) References Cited

U.S. PATENT DOCUMENTS

| 8,610,229 | B2* | 12/2013 | Hsu | H01L 27/14685 257/E31.127 |
| 9,704,904 | B2 | 7/2017 | Lai et al. | |
| 2013/0043372 | A1* | 2/2013 | Wehner | H01L 27/14652 250/208.1 |
| 2014/0291480 | A1* | 10/2014 | Bruder | G01S 3/781 250/206 |
| 2016/0118438 | A1* | 4/2016 | Leung | H01L 27/14623 257/229 |
| 2018/0366513 | A1* | 12/2018 | Yang | H01L 27/14831 |
| 2020/0321376 | A1* | 10/2020 | Noudo | H01L 27/14627 |
| 2021/0143193 | A1* | 5/2021 | Takizawa | H01L 27/14645 |
| 2021/0366967 | A1* | 11/2021 | Cheng | H01L 27/14689 |
| 2021/0377481 | A1* | 12/2021 | Hsieh | H04N 5/379 |

\* cited by examiner

*Primary Examiner* — Que Tan Le
*Assistant Examiner* — Mai Thi Ngoc Tran
(74) *Attorney, Agent, or Firm* — Cozen O'Connor

(57) ABSTRACT

A pixel-array substrate includes a semiconductor substrate, a buffer layer, and a metal annulus. The semiconductor substrate includes a first-photodiode region. A back surface of the semiconductor substrate forms a trench surrounding the first-photodiode region in a cross-sectional plane parallel to a first back-surface region of the back surface above the first-photodiode region. The buffer layer is on the back surface and has (i) a thin buffer-layer region located above the first-photodiode region and (ii) a thick buffer-layer region forming an annulus above the trench in a plane parallel to the cross-sectional plane. The metal annulus is on the buffer layer and covers the thick buffer-layer region.

20 Claims, 8 Drawing Sheets

REDUCED CROSS-TALK PIXEL-ARRAY SUBSTRATE AND FABRICATION METHOD

BACKGROUND

Camera modules in commercial products such as stand-alone digital cameras, mobile devices, automotive components, and medical devices include an image sensor. The image sensor includes multiple pixels forming a pixel array, often also include at least one of multiple microlenses forming a microlens array, and multiple color filters forming a color-filter array located between the pixel array and the microlens array. Each color filter of the color filter array is aligned to a respective pixel of the pixel array. Similarly, each microlens of the microlens array is aligned to a respective pixel of the pixel array. Images produced by image sensors often include artifacts resulting from either electrical or optical sources. Optical cross-talk is one such artifact and refers to light detected by a first pixel of the pixel array after having propagated through a microlens and/or a color filter aligned to a second pixel of the pixel array. One source of optical cross-talk occurs when the incident light propagates through the microlens at a sufficiently high incident angle with respect to a surface-normal of the pixel array.

SUMMARY OF THE EMBODIMENTS

Embodiments disclosed herein reduce optical cross-talk by preventing the aforementioned source of cross-talk. In a first aspect, a pixel-array substrate includes a semiconductor substrate, a buffer layer, and a metal annulus. The semiconductor substrate includes a first-photodiode region. A back surface of the semiconductor substrate forms a trench surrounding the first-photodiode region in a cross-sectional plane parallel to a first back-surface region of the back surface above the first-photodiode region. The buffer layer is on the back surface and has (i) a thin buffer-layer region located above the first-photodiode region and (ii) a thick buffer-layer region forming an annulus above the trench in a plane parallel to the cross-sectional plane. The metal annulus is on the buffer layer and covers the thick buffer-layer region.

In a second aspect, a method for fabricating a pixel-array substrate includes (i) forming a metal annulus on a buffer layer disposed on a semiconductor substrate; (ii) decreasing a thickness of buffer-layer regions of the buffer layer not located beneath the metal annulus to yield a thinned buffer layer and; (iii) depositing a conformal metal layer on the thinned buffer layer and the metal annulus.

DETAILED DESCRIPTION OF THE EMBODIMENTS

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" may encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it may be the only layer between the two layers, or one or more intervening layers may also be present.

The term semiconductor substrate may refer to substrates formed using semiconductors such as silicon, silicon-germanium, germanium, gallium arsenide, and combinations thereof. The term semiconductor substrate may also refer to a substrate, formed of one or more semiconductors, subjected to previous process steps that form regions and/or junctions in the substrate. A semiconductor substrate may also include various features, such as doped and undoped semiconductors, epitaxial layers of silicon, and other semiconductor structures formed upon the substrate.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meanings.

Figure 1:
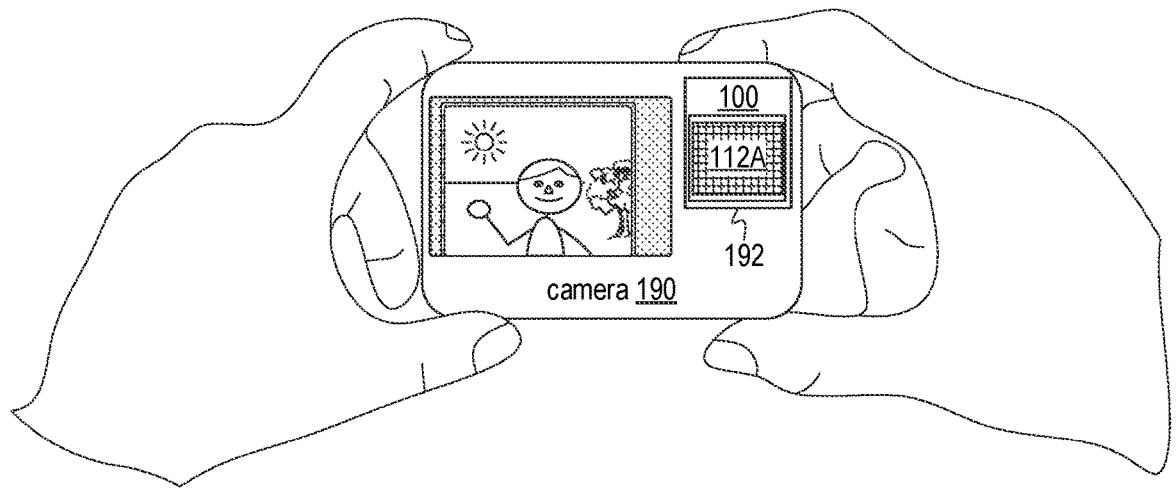
FIG. 1 depicts a camera imaging a scene.

FIG. 1 depicts a camera 190 imaging a scene. Camera 190 includes an image sensor 192, which includes a pixel-array substrate 100. Constituent elements of pixel-array substrate 100 may include at least one of silicon and germanium. Pixel-array substrate 100 includes a pixel array 112A. Image sensor 192 may part of a chip-scale package or a chip-on-board package.

Figure 2:
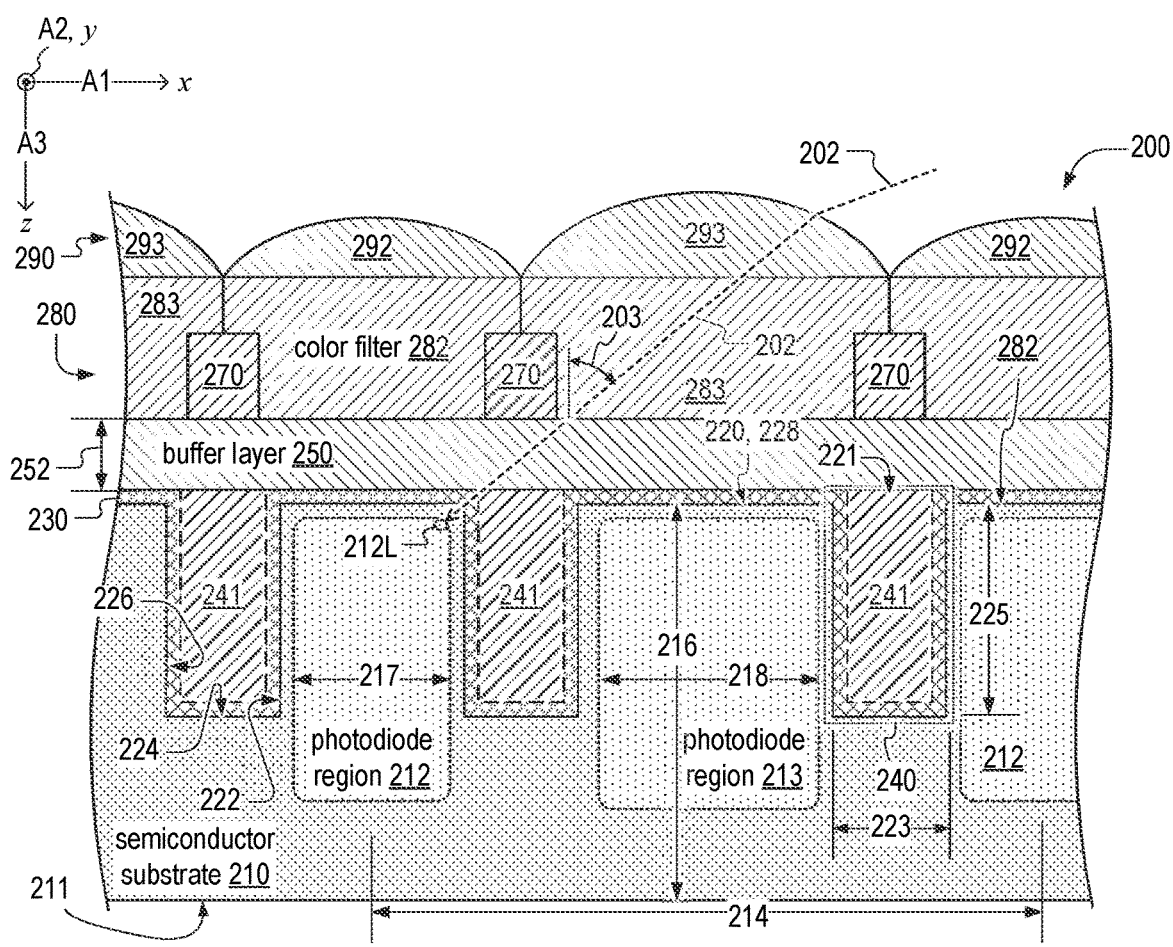
FIG. 2 cross-sectional schematic of a pixel-array substrate, which is an embodiment of a pixel-array substrate of the camera of FIG. 1.

FIG. 2 cross-sectional schematic of a pixel-array substrate 200, which is an example of pixel-array substrate 100. The cross-section illustrated in FIG. 2 is parallel to a plane, hereinafter the x-z plane, formed by orthogonal axes A1 and A3, which are each orthogonal to an axis A2. Herein, the x-y plane is formed by orthogonal axes A1 and A2, and planes parallel to the x-y plane are referred to as transverse planes. Unless otherwise specified, heights of objects herein refer to the object's extent along axis A3. Herein, a reference to an axis x, y, or z refers to axes A1, A2, and A3 respectively. Also, herein, a horizontal plane is parallel to the x-y plane, a width refers to an object's extent along the y axis, and a vertical direction is along the z axis.

Pixel-array substrate 200 includes a semiconductor substrate 210, a passivation layer 230, a buffer layer 250, a metal annulus 270, and a color filter array 280. Metal annulus 270 and color filter array 280 are on buffer layer 250. Pixel-array substrate 200 also includes a microlens array 290 that includes a plurality of microlenses 292 and 293. Each microlens 292 is aligned to a respective photodiode region 212 for directing light thereto. Each microlens 293 is aligned to a respective photodiode region 213 for directing light thereto.

Semiconductor substrate 210 includes one or more photodiode regions 212. A back surface 220 of semiconductor substrate 210 forms a trench 221 surrounding each photodiode region 212 in a cross-sectional plane parallel to a back-surface region 228 of back surface 220 above photodiode region 212. Trench 221 isolates small-photodiode region 212 from adjacent large-photodiode regions 213. Back-surface region 228 may be parallel to the x-y plane. Buffer layer 250 is on back surface 220 and has a uniform thickness 252.

Constituent elements of semiconductor substrate 210 may include at least one of silicon and germanium. Semiconductor substrate 210 includes a front surface 211 opposite back surface 220. Back surface 220 includes an inner-sidewall surface-region 222, an outer-sidewall surface-region 226, and a bottom surface-region 224 that form trench 221.

Semiconductor substrate 210 has a thickness 216 between front surface 211 and back surface-region 228. Trench 221 has a width 223 and a depth 225 in the horizontal and vertical directions respectively. Width 223 may be between 0.10 micrometers and 0.25 micrometers. Depth 225 is with respect to back surface-region 228, and may be between 0.5 micrometers and 2.0 micrometers. In embodiments, thickness 216 exceeds depth 225 by between 0.5 micrometers and 2.0 micrometers to ensure sufficient electrical isolation.

In embodiments, passivation layer 230 covers back-surface region 228 and is located between metal annulus 270 and semiconductor substrate 210. In embodiments, passivation layer 230 adjoins back surface 220. In embodiments, an additional material layer is between passivation layer 230 and back surface 220. The additional layer may be thinner than passivation layer 230, and may be formed of an oxide. In embodiments, passivation layer 230 conformally covers surface-regions 222, 224, and 226 of each trench 221. Passivation layer 230 may be formed of a high-κ material, e.g., a material having a dielectric constant κ greater than or equal that of silicon nitride (κ≥7). Passivation layer 230 may have fixed negative charges creating a hole accumulation layer at its surface interface with semiconductor substrate 210. Aluminum oxide ($Al_2O_3$) and hafnium oxide ($HfO_2$) are examples of such a high-κ material.

In embodiments, each trench 221 is filled with a trench-fill material 241. Trench 221, parts of passivation layer 230 therein, and trench-fill material 241 form a deep-trench isolation (DTI) structure 240. Trench-fill material 241 may be an oxide, a metal, or a combination thereof.

In embodiments, semiconductor substrate 210 includes a two-dimensional array of photodiode regions 212, where respective directions of rows and columns of the two-dimensional array define respective directions of axes A2 and A1. Adjacent photodiode regions 212 are separated by a pixel-pitch 214 in each of the x and y directions. In embodiments, each photodiode region 212 is part of a respective pixel of a pixel array formed in semiconductor substrate 210.

In embodiments, semiconductor substrate 210 also includes a two-dimensional array of photodiode regions 213. Adjacent photodiode regions 213 are separated by pixel-pitch 214. Each photodiode region 213 is between a respective pair of adjacent photodiode regions 212. Photodiode regions 213 are part of a pixel array that is interleaved with a pixel array that includes the two-dimensional photodiode array of photodiode regions 212.

Color filter array 280 includes a plurality of color filters 282 and 283 for spectrally filtering light transmitted through a microlens 292 or 293 aligned thereto. Each color filter 282 is aligned to a respective photodiode region 212. Each color filter 283 is aligned to a respective photodiode region 213. Herein, a color filter or a microlens is aligned to a photodiode region when part of the color filter or microlens is directly above a center of the photodiode region.

Photodiode regions 212 and 213 have respective widths 217 and 218. In embodiments, width 218 exceeds width 217. In embodiments, width 217 is between 0.7 micrometers and 1.0 micrometers. In embodiments, at least one of width 218 and pixel-pitch 214 is between 0.7 micrometers and 3.0 micrometers.

Buffer layer 250 has a thickness 252 and may be formed of an oxide material. In embodiments, buffer layer 250 is thinned to thickness 252 via chemical mechanical polishing (CMP). CMP induces mechanical stress on passivation layer 230, the high-κ layer therebeneath, and top surface 228. The magnitude of the induced mechanical stress increases as the CMP thins buffer layer 250, which can result in dark-current and white-pixel image artifacts in images captured by camera 190. In embodiments, thickness 252 exceeds 0.1 micrometers to provide sufficient thickness for stress relief and to prevent such artifacts.

A cost of requiring thickness 252 to exceed 0.1 micrometers is increased vulnerability to increased optical cross-talk from a large photodiode region 213 to an adjacent small photodiode region 212. For example, FIG. 2 illustrates an optical ray 202 that is refracted by a microlens 293 such that it is incident on buffer layer at an incident angle 203. If properly detected, optical ray 202 would reach photodiode region 213 beneath microlens 293. However, after refraction by microlens 293, optical ray 202 propagates through color filter 280(1) and reaches photodiode region 212 at a location 212L thereof, which results in optical cross-talk.

Figure 3:
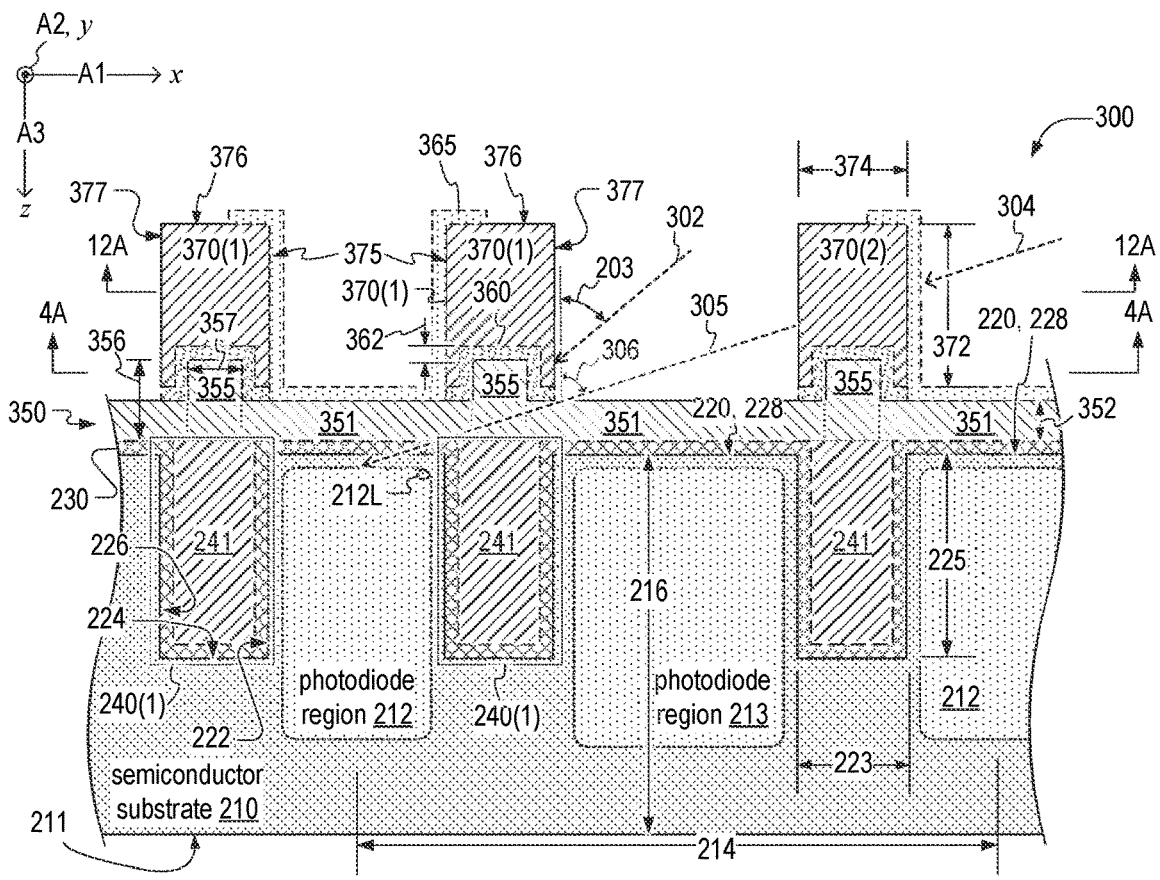
FIG. 3 cross-sectional schematic of a second pixel-array substrate, which is an embodiment of a pixel-array substrate of the camera of FIG. 1.

FIG. 3 cross-sectional schematic of a reduced cross-talk pixel-array substrate 300, hereinafter pixel-array substrate 300. Pixel-array substrate 300 remedies the optical cross-talk caused by optical ray 202 and the like. Pixel-array substrate 300 is an example of pixel-array substrate 100.

Pixel-array substrate 300 includes semiconductor substrate 210, a buffer layer 350, and a metal annulus 370. In a horizontal plane, a metal annulus 370 has an aperture, the shape of which may be polygonal (such as square, rectangular, or hexagonal), or circular.

In embodiments, at least one of (a) buffer layer 350 is formed of an oxide material and (b) metal annulus 370 is formed of a metal such as tungsten or aluminum. In embodiments, pixel-array substrate 300 includes an adhesion layer 360 between thick buffer-layer region 355 and metal annulus 370. Adhesion layer 360 may be formed of titanium nitride. Adhesion layer 360 has a thickness 362, which may be in a vertical and/or a horizontal direction. In embodiments, thickness 362 is between twenty nanometers and forty nanometers.

In embodiments, adhesion layer 360 is formed of at least one of titanium and titanium nitride. Adhesion layer 360 may include a layer of titanium and a layer of titanium nitride such that it functions as both an adhesive and metal barrier. For example, the titanium layer adheres metal annulus 370 to the thick buffer-layer region 355. The titanium nitride layer functions as a diffusion barrier that prevents metal ions from diffusing from metal annulus 370 into semiconductor substrate 210.

Buffer layer 350 is on back surface 220 and has (i) a thin buffer-layer region 351 located above photodiode regions 212 and 213 and (ii) a thick buffer-layer region 355 between adjacent thin buffer-layer regions 351 and above trench 240. Thick buffer-layer region 355 forms an annulus above trench 221 in a plane parallel to a cross-sectional plane 4A. Metal annulus 370 is on buffer layer 350 and covers thick buffer-layer region 355. FIG. 3 denotes a metal annulus 370(1) and part of an adjacent metal annulus 370(2). The DTI structure 240 beneath metal annulus 370(1) is denoted as DTI structure 240(1).

Thin buffer-layer region 351 has a thickness 352, which is less than thickness 252 of buffer layer 250 of pixel-array substrate 200, FIG. 2. Thickness 352 is sufficiently thin to prevent optical rays from propagating between metal annulus 370(1) and DTI structure 240(1). In embodiments, thickness 352 is between twenty nanometers and forty nanometers.

For example, FIG. 3 illustrates an optical ray 302 that is incident on buffer layer 350 at an incident angle 203, which is the same incident angle as optical ray 202. In embodiments, ray 302 propagates at incident angle 203 after having been refracted by a microlens (not shown) aligned above large photodiode region 213. Optical ray 202 results in optical crosstalk in pixel-array substrate 200, FIG. 2. Optical ray 302 has a trajectory that, like optical ray 202, intersects location 212L of photodiode region 212. Yet, since thickness 352 of thin buffer-layer region 351 is sufficiently small, e.g., less than thickness 252 of buffer layer 250, metal annulus 370(1) blocks optical ray 302, and hence prevents optical ray 302 from reaching location 212L of small photodiode region 212 and causing optical cross-talk. In a second example, FIG. 3 illustrates optical rays 304 and 305. Optical ray 305 propagates between metal annulus 370(1) and DTI structure 240(1) such that it reaches photodiode region 212. Absent metal annulus 370(2), optical ray 305 is a continuation of optical ray 304. However, for optical ray 305 to traverse such a path, thickness 352 requires that its propagation angle 306 must be so large that metal annulus 370(2) is between photodiode region 212 and optical ray 304, such that optical ray 304 is blocked before it can propagate (as optical ray 305) to photodiode region 212.

Thick buffer-layer region 355 has a thickness 356 and a width 357. In embodiments, thickness 356 is between 0.10 micrometers and 0.16 micrometers. The lower limit is for preventing the aforementioned surface stress that results in image artifacts. The upper limit is for maintaining an adequately broad angular response, as a function of chief-ray angle for example, of pixels that include a photodiode region 212. In embodiments, width 357 is between 0.10 micrometers and 0.20 micrometers. The upper limit of width 357 is important for allowing etching buffer layer 350 to thickness 352 above photodiode regions 212.

Metal annulus 370 has a height 372 and a width 374. In embodiments, height 372 is between 0.1 micrometers and 0.3 micrometers, which balances a tradeoff between crosstalk reduction and angular response of pixels that include a photodiode region 212. In embodiments, width 374 is between 0.16 micrometers and 0.26 micrometers. The upper limit of width 374 is important for allowing etching buffer layer 350 to thickness 352 between metal annuluses above photodiode regions 212, 213.

Metal annulus 370 has an inner sidewall 375, a top surface 376, and an outer sidewall 377. In embodiments, pixel-array substrate 300 also includes attenuation layer 365 on (i) parts of thin buffer-layer region 351 above photodiode region 212 and (ii) inner sidewall 375 for attenuating incident light propagating toward photodiode region 212. Attenuation layer 365 may also cover at least part of top surface 376, and may be formed of one of titanium, titanium nitride, and a combination thereof. In embodiments, a thickness of attenuation layer 365 is between twenty nanometers and fifty nanometers. In embodiments, attenuation layer 365 is conformal to at least one of surface 375, 376, and a top surface of thin buffer-layer region 351 above photodiode region 212. In embodiments, attenuation layer 365 reduces the light sensitivity of photodiode region 212, thereby lowering the quantum efficiency of photodiode region 212.

Figure 4:
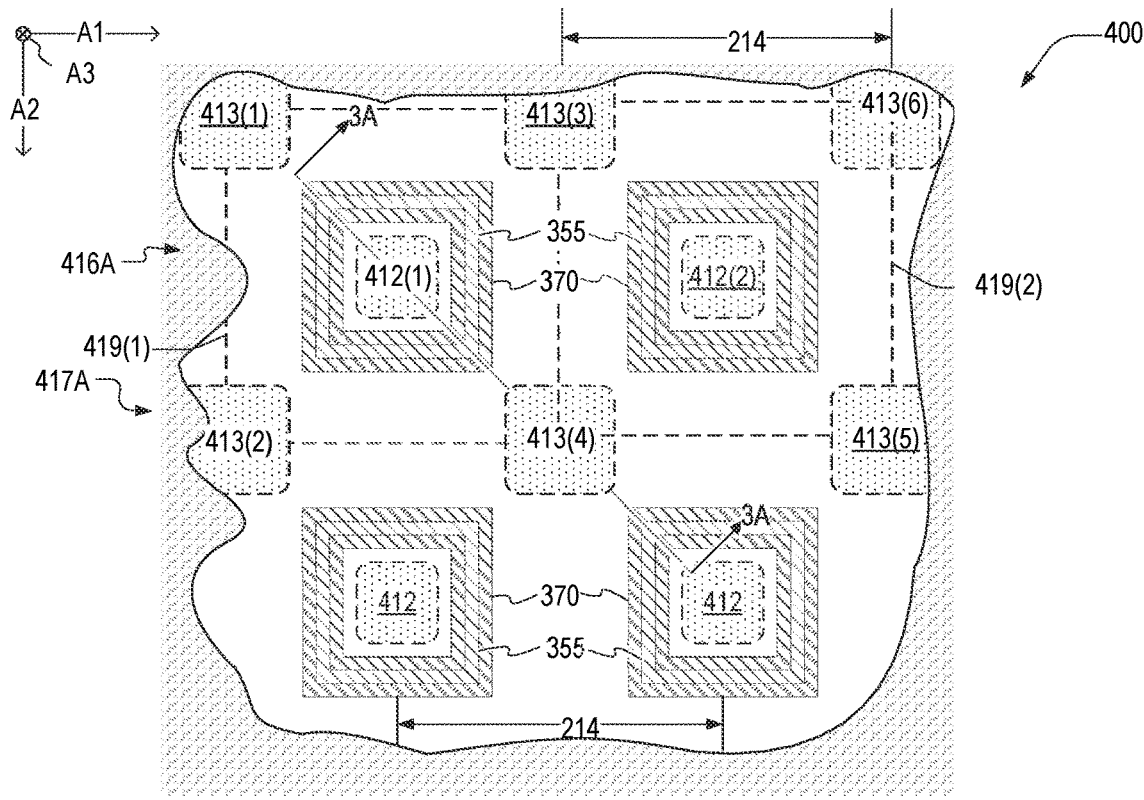
FIG. 4 is a cross-sectional schematic of a pixel-array substrate, which is an embodiment of the pixel-array substrate of FIG. 3.

FIG. 4 is a cross-sectional schematic of a pixel-array substrate 400, which is an example of pixel-array substrate 300. The cross-section of FIG. 4 is in cross-sectional plane 4A shown in FIG. 3. FIG. 4 denotes a cross-sectional plane 3A, which is an example of the cross-sectional plane of FIG. 3. Pixel-array substrate 400 includes a plurality of photodiode regions 412 and a plurality of photodiode regions 413, which are respective examples of photodiode regions 212 and a plurality of photodiode regions 213. While cross-sectional plane 4A does not intersect photodiode regions 412 and 413, FIG. 4 illustrates photodiode regions 412 and 413 to show their positions with respect to metal annulus 370 and thick buffer-layer region 355. Since pixel-array substrate 400 is an example of pixel-array substrate 300, pixel-array substrate 400 may include attenuation layer 365, not shown in FIG. 4.

In embodiments, each photodiode region 412 is located within a quadrilateral region defined by respective photodiode regions 413 that form a two-by-two array of photodiode regions 413. In embodiments, the shape of the quadrilateral region is one of a square, a rectangle, and a parallelogram. For example, photodiode region 412(1) is located within a rectangular area 419(1) defined by respective centers of photodiode regions 413(1-4) and 412(2) is located within a rectangular area 419(2) defined by respective centers of photodiode regions 413(3-6). In embodiments, photodiode regions 412(1) and 412(2) are located at respective centers of rectangular area 419(1) and 419(2).

In an embodiment, a device transistor region (not illustrated for simplicity) is defined on front surface 211 in a region between adjacent photodiode regions 212 or a region between adjacent photodiode regions 213. The device transistor region includes pixel transistors (e.g., source follower, reset transistor, row select) formed on front surface 211 controlling the operation of respective pixel containing photodiode regions 212 or 213.

In embodiments, each photodiode region 412 is part of a respective pixel of a pixel array 416A formed in a semiconductor substrate 210, and each photodiode region 413 is part of a respective pixel of a pixel array 417A formed in semiconductor substrate 210. Pixel-array substrate 400 is an example of pixel-array substrate 100, such that, in embodiments, pixel array 112A includes both pixel array 416A and pixel array 417A. Semiconductor substrate 210 is an example of semiconductor substrate 210.

Figure 5:
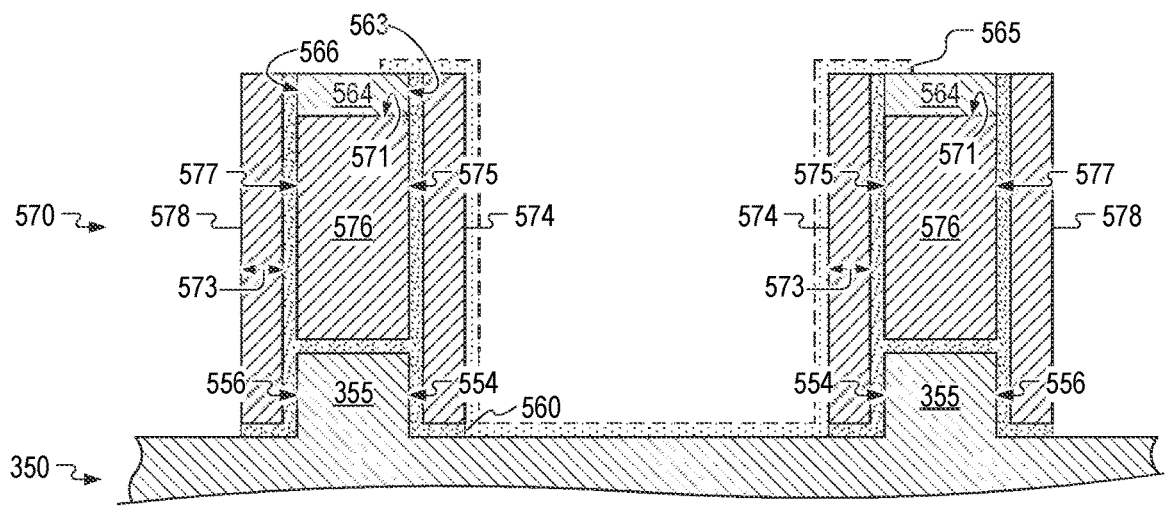
FIG. 5 is a cross-sectional schematic of a metal annulus, which is an example of the metal annulus of the pixel-array substrate of FIG. 3.

FIG. 5 is a cross-sectional schematic of a metal annulus 570 on buffer layer 350. Metal annulus 570 is an example of metal annulus 370 and includes a middle section 576, an inner section 574, and an outer section 578. Middle section 576 has an inner sidewall 575, a top surface 571, and an outer sidewall 577. Middle section 576 is on thick buffer-layer region 355 and surrounds inner section 574. Inner section 574 is adhered to both inner sidewall 575 and an inner sidewall 554 of thick buffer-layer region 355. Outer section 578 adhered to both outer sidewall 577 and an outer sidewall 556 of thick buffer-layer region 355. Inner section 574 and outer section 578 have a thickness 573. In embodiments, thickness 573 is between twenty nanometers and forty nanometers.

In embodiments, metal annulus 570 also includes an adhesion layer 560, which is an example of adhesion layer 360. Adhesion layer 560 bonds at least one of (i) middle section 576 to thick buffer-layer region 355, (ii) inner section 574 to both inner sidewall 575 and inner sidewall 554, and outer section 578 to both outer sidewall 577 and outer sidewall 556.

In embodiments, metal annulus 570 also includes a dielectric annular layer 564 on top surface 571. Annular layer 564 has an inner surface 563 and an outer surface 566. Inner surface 563 may be covered with part of inner section 574 bonded thereto. Outer surface 566 may be covered with part of outer section 578 bonded thereto.

Buffer layer 350 and metal annulus 570 are parts of an embodiment of pixel-array substrate 300. This embodiment may also include an attenuation layer 565 covering thin buffer-layer region 351 of buffer layer 350 above the photodiode region 212. In embodiments, attenuation layer 565 further covers inner section 574, and parts of adhesion layer 560 and annular layer 564. Attenuation layer 565 is an example of attenuation layer 365, FIG. 3.

Figure 6:
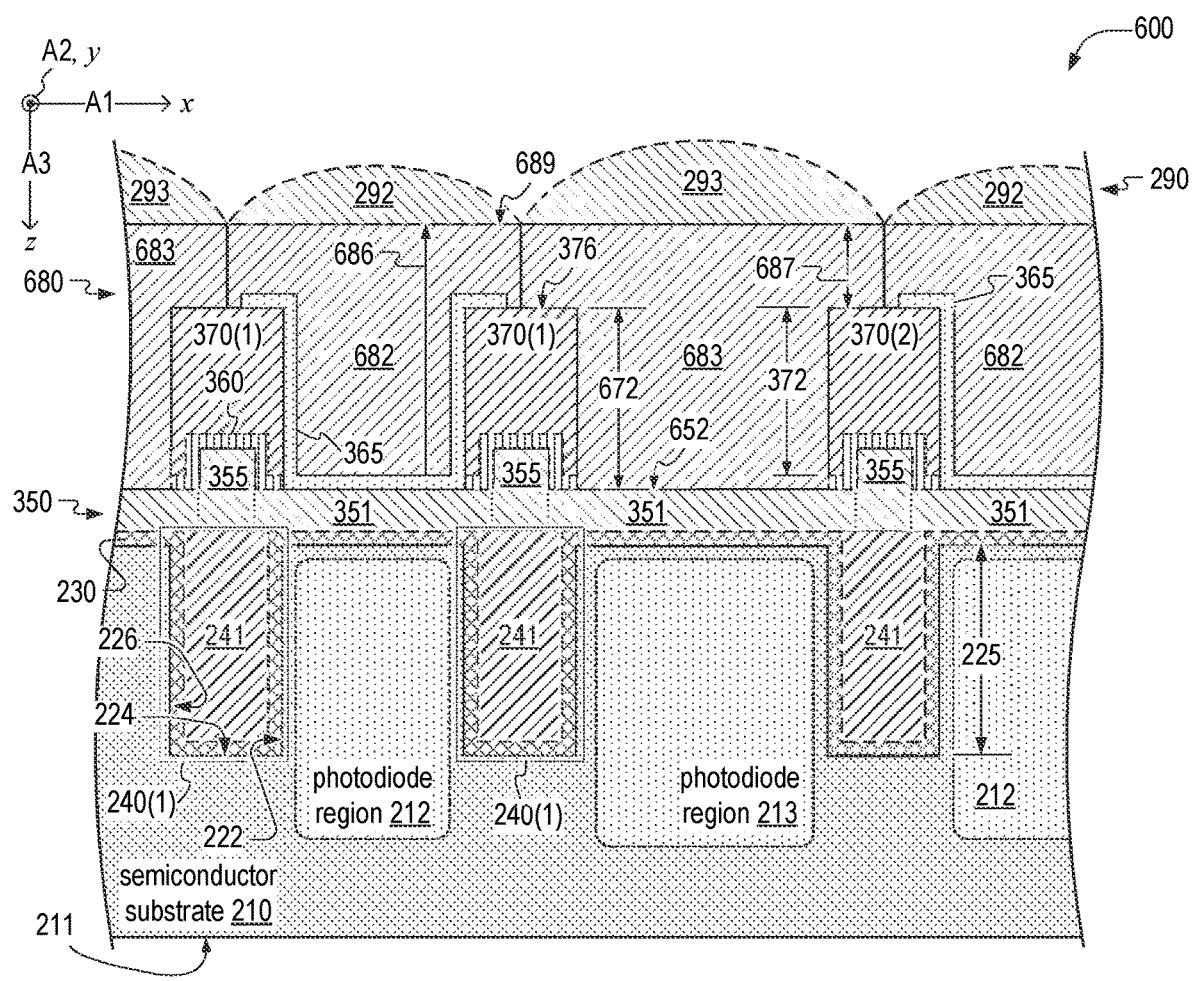
FIG. 6 cross-sectional schematic of a pixel-array substrate, which is an embodiment of the pixel-array substrate of FIG. 3.

FIG. 6 cross-sectional schematic of a pixel-array substrate 600, which is pixel-array substrate 300 with the addition of color filter array 680 on buffer layer 350. Color filter array 680 is similar to color filter array 280, and includes color filters 682 and 683, which are analogous to color filters 282 and 283, respectively. Each color filter 682 is aligned to a respective photodiode region 212. Each color filter 683 is aligned to a respective photodiode region 213.

Top surface 376 of metal annulus 370 is at a height 672 with respect to a top surface 652 of thin buffer-layer region 351. Color filter array 680 has a top surface 689, which is at a height 686 with respect to top surface 652. An optimal range of height 686 is determined by balancing a trade-off between filtering undesired wavelengths and attenuating desired wavelengths of illumination incident on photodiode regions 212 and 213. Height 686 exceeds height 672 by a distance 687, which, in embodiments, is between five nanometers and forty nanometers. Each metal annulus 370 is embedded in color filter array 680.

In embodiments, pixel-array substrate 600 also includes microlens array 290, which includes the plurality of microlenses 292 and 293. Each microlens 292 is aligned to a respective photodiode region 212 for directing incident light thereon to photodiode region 212. Each microlens 293 is aligned to a respective photodiode region 213 for directing incident light thereon to photodiode region 213.

Figure 7:
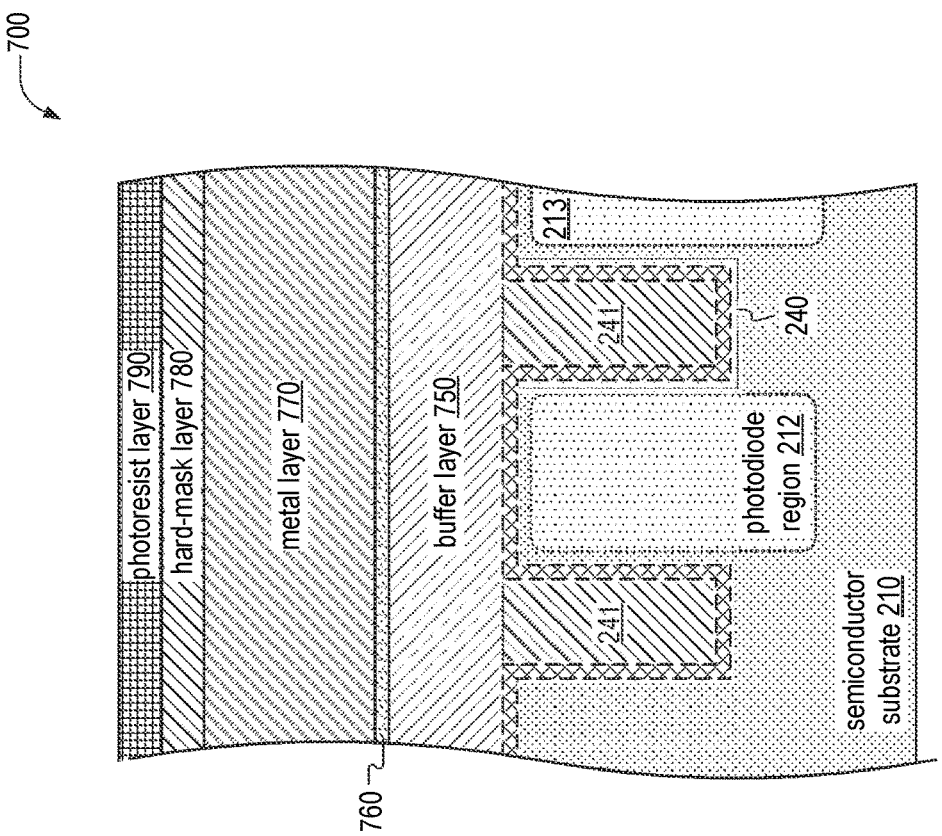

FIGS. 7-10 are respective cross-sectional schematics of intermediate substrates formed in a process of fabricating pixel-array substrate 300. FIG. 7 is a cross-sectional schematic of an intermediate substrate 700, which includes semiconductor substrate 210 having passivation layer 230, a buffer layer 750, an adhesion layer 760, a metal layer 770, a hard-mask layer 780, and a photoresist layer 790 disposed thereon. Each trench 221 of semiconductor substrate 210 is filled with trench-fill material 241. In embodiments, the thickness of buffer layer 750 is between 0.10 micrometers and 0.16 micrometers.

Figure 8:
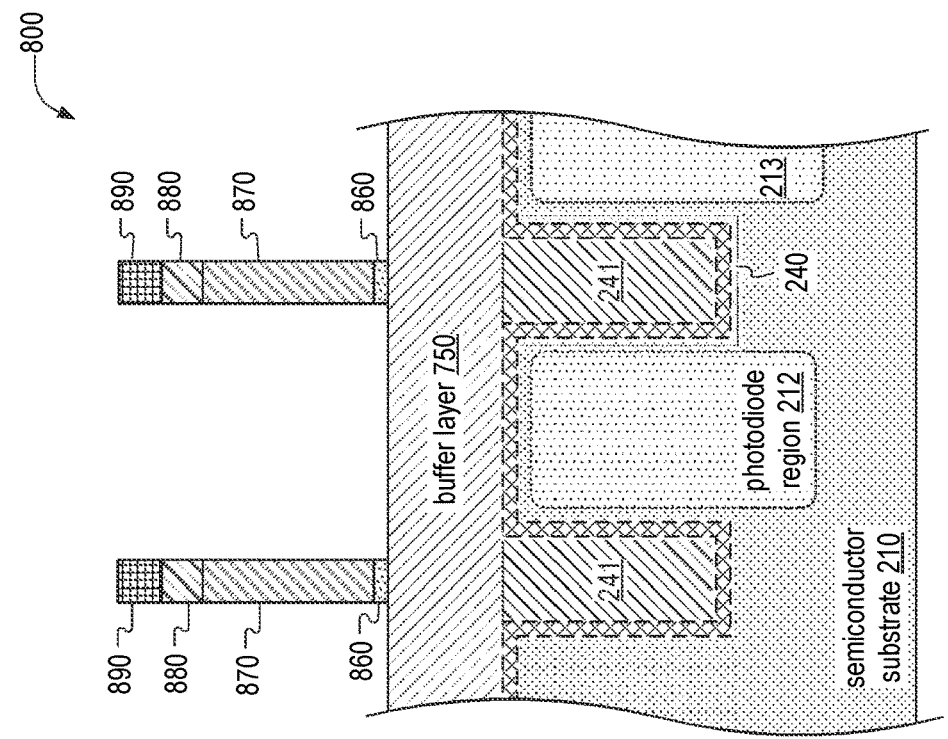
FIGS. 7-10 are respective cross-sectional schematics of intermediate substrates formed in a process of fabricating the pixel-array substrate, in an embodiment.

FIG. 8 is a cross-sectional schematic of an intermediate substrate 800, which is intermediate substrate 700 after removal of sections of layers 770, 780, and 790, via dry etching for example, above photodiode regions 212 and 213. Intermediate substrate 800 includes an adhesion layer 860, a metal annulus 870, a mask layer 880, and a photoresist layer 890 which are respective remaining sections of adhesion layer 760, metal layer 770, mask layer 780, and photoresist layer 790, after a layer-removing process such as etching.

Figure 9:
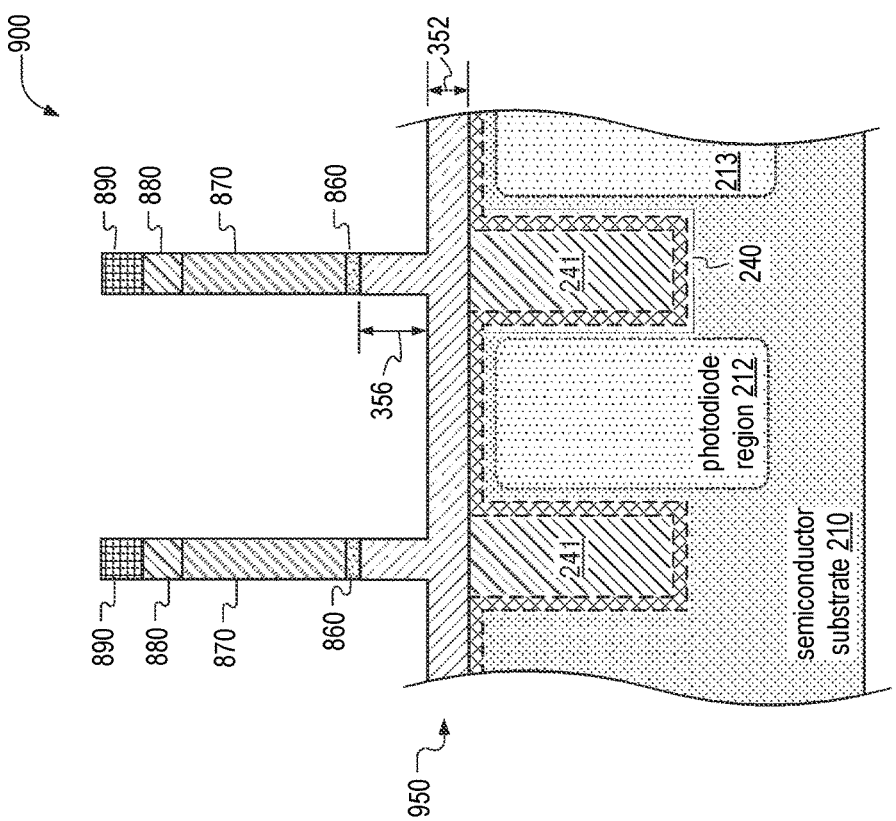

FIG. 9 is a cross-sectional schematic of an intermediate substrate 900. Intermediate substrate 900 is intermediate substrate 800 after removal of sections of layer 750, via etching for example, above photodiode regions 212 and 213 to thin sections of layer 750 above photodiode regions 212 and 213 to yield a buffer layer 950. Buffer layer 950 is an example of buffer layer 350, FIG. 3, and has thicknesses 352 and 356 of buffer layer 350. Intermediate substrate 800 also includes adhesion layer 860, metal annulus 870, annular mask layer 880, and photoresist layer 890.

Figure 10:
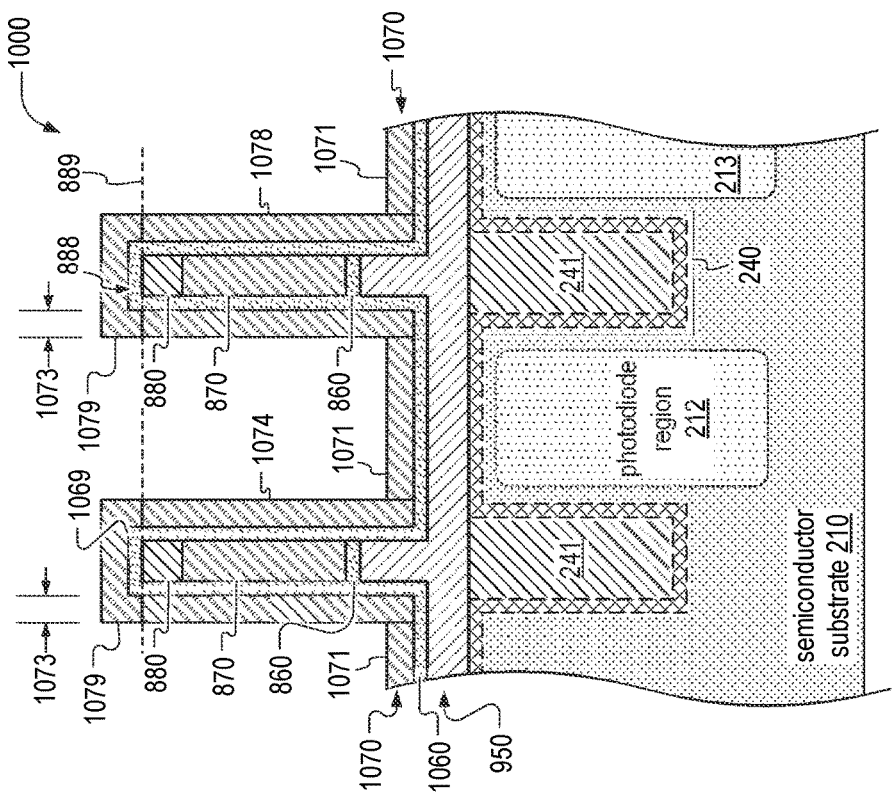

FIG. 10 is a cross-sectional schematic of an intermediate substrate 1000, which is intermediate substrate 900 after removal of photoresist layer 890 and subsequent deposition of an adhesion layer 1060 and a metal layer 1070 thereon. Metal layer 1070 has a width 1073, which in embodiments is in the same range of thickness 573 of inner section 574 and outer section 578 of metal annulus 570, FIG. 5.

Mask layer 880 has a top surface 888 in a plane 889. FIG. 10 denotes an inner section 1074 and an outer section 1078 of metal layer 1070 between adhesion layer 1060 and plane 889, and horizontal sections 1071 of metal layer 1070 on adhesion layer 1060. FIG. 10 also denotes a cap section 1079 of metal layer 1070 and a cap section 1069 of adhesion layer 1060, each of which is above plane 889.

Removing horizontal sections 1071, a region of cap section 1079 above annulus 870, and part of adhesion layer 1060 above plane 889 yields metal annulus 570, FIG. 5. Metal annulus 870 corresponds to middle section 576; annular mask layer 880 corresponds to dielectric annular layer 564. Inner section 1074 and outer section 1078 of metal layer 1070 correspond to inner section 574 and outer section 578, respectively.

Figure 11:
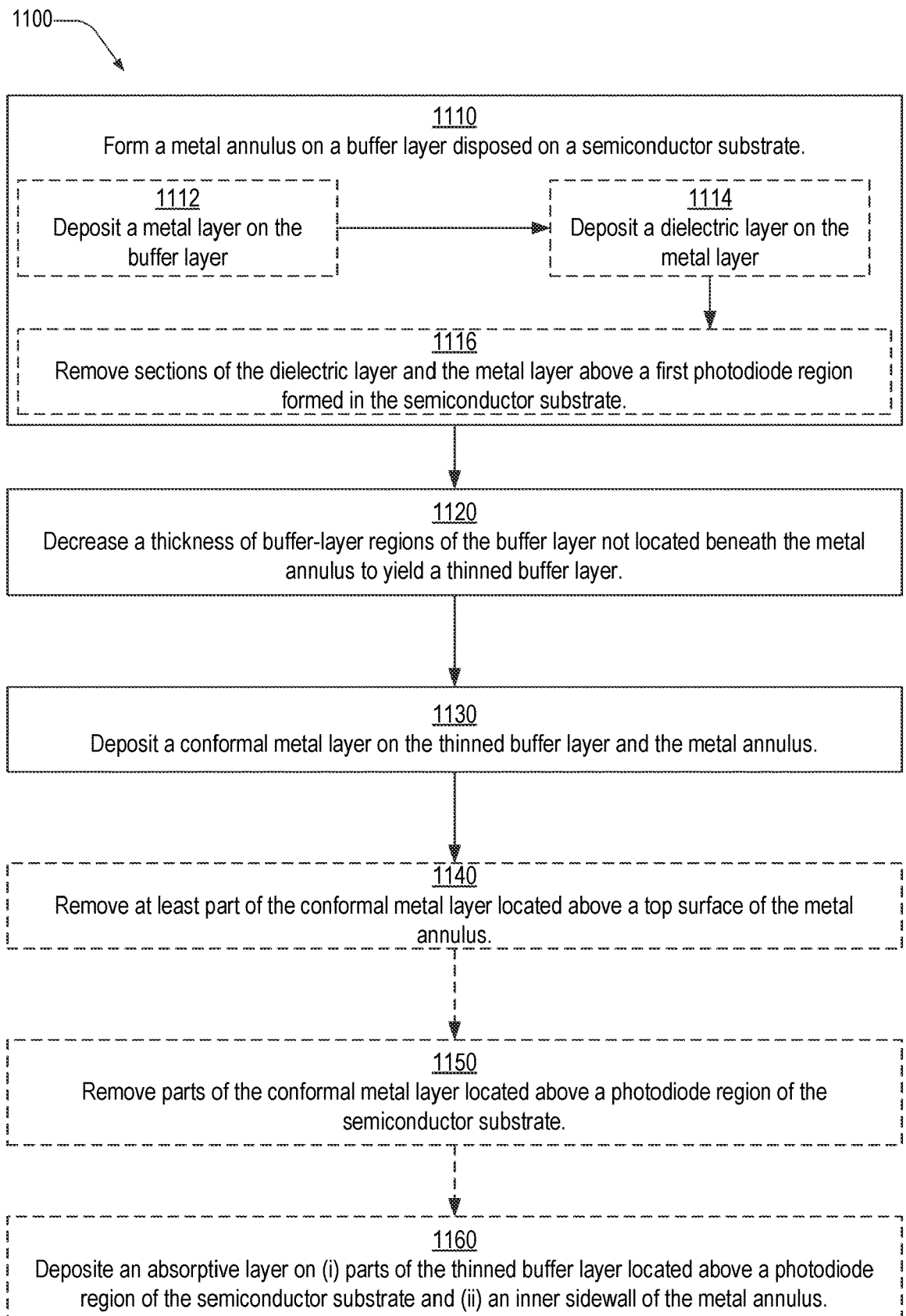
FIG. 11 is a flowchart illustrating a method for fabricating the pixel-array substrate of FIG. 3, in an embodiment.

FIG. 11 is a flowchart illustrating a method 1100 for fabricating a pixel-array substrate. Method 1100 includes steps 1110, 1120, and 1130. In embodiments, method 1100 also includes at least one of steps 1140, 1150, and 1160.

Step 1110 includes forming a metal annulus on a buffer layer disposed on a semiconductor substrate. In an example of step 1110, metal annulus 870 of intermediate substrate 800 of FIG. 8 is formed, via a lithographic process for example, from intermediate substrate 700 of FIG. 7.

In embodiments, step 1110 includes at least one of steps 1112, 1114, and 1116. Step 1112 includes depositing a metal layer on the buffer layer. In an example of step 1112, metal layer 770 is deposited on buffer layer 750, or on adhesion layer 760, FIG. 7. Step 1114 includes depositing a dielectric layer on the metal layer. In an example of step 1114, at least one of hard mask layer 780 and photoresist layer 790 is deposited on metal layer 770. Step 1116 includes removing sections of the dielectric layer and the metal layer above a first photodiode region formed in the semiconductor substrate to yield the metal annulus. In an example of step 1116, sections of layers 760, 770, 780, and 790 above photodiode region 212 are removed to yield metal annulus 870. In embodiments, step 1116 further includes removing sections of the dielectric layer and the metal layer above a second photodiode region adjacent to the first photodiode region formed in the semiconductor substrate to yield the metal annulus. In another example of step 1116, sections of layers 760, 770, 780, and 790 above photodiode region 213 are also removed to yield a metal annulus aligned to photodiode region 213.

Step 1120 includes decreasing a thickness of buffer-layer regions of the buffer layer not located beneath the metal annulus to yield a thinned buffer layer located above the first photodiode. In an example of step 1120, regions of buffer layer 750 not located beneath metal annulus 870 are thinned, via dry etching example, to yield buffer layer 950, FIG. 9.

Step 1130 includes depositing a conformal metal layer on the thinned buffer layer and the metal annulus. In an example of step 1130, metal layer 1070 is deposited on metal annulus 870 and part of buffer layer 950, as shown in FIG. 10. In embodiments, prior to deposition of metal layer 1070, adhesion layer 1060 is conformally deposited on metal annulus 870, mask layer 880 and buffer layer 950 to strengthen the attachment of conformal metal layer to metal annulus 870.

Step 1140 includes removing at least part of the conformal metal layer located above a top surface of the metal annulus. In an example of step 1140, cap section 1069 and cap section 1079 are removed via etching.

Step 1150 includes removing parts of the conformal metal layer located above a photodiode region of the semiconductor substrate. In an example of step 1150, horizontal sections 1071 of metal layer 1070 (e.g., sections 1071 and 1079) located above photodiode regions 212, 213 are removed to yield metal annulus 570, FIG. 5. In embodiments, step 1150 further includes removing parts of the adhesive layer located above a photodiode region of the semiconductor substrate. Steps 1140 and 1150 may be performed in a single step, such as a single blanket etching step.

Step 1160 includes depositing an attenuation layer on (i) parts of the thinned buffer layer located above a photodiode region of the semiconductor substrate and (ii) an inner sidewall of the metal annulus. In an example of step 1160, layer 365 is deposited on thin buffer-layer region 351 located above photodiode region 212 and inner sidewall 375 of metal annulus 370. In another example of step 1160, attenuation layer 565 is deposited on thin buffer-layer region 351 of buffer layer 350 above the photodiode region 212, inner section 574, and parts of adhesion layer 560 and parts of annular layer 564.

Figure 12:
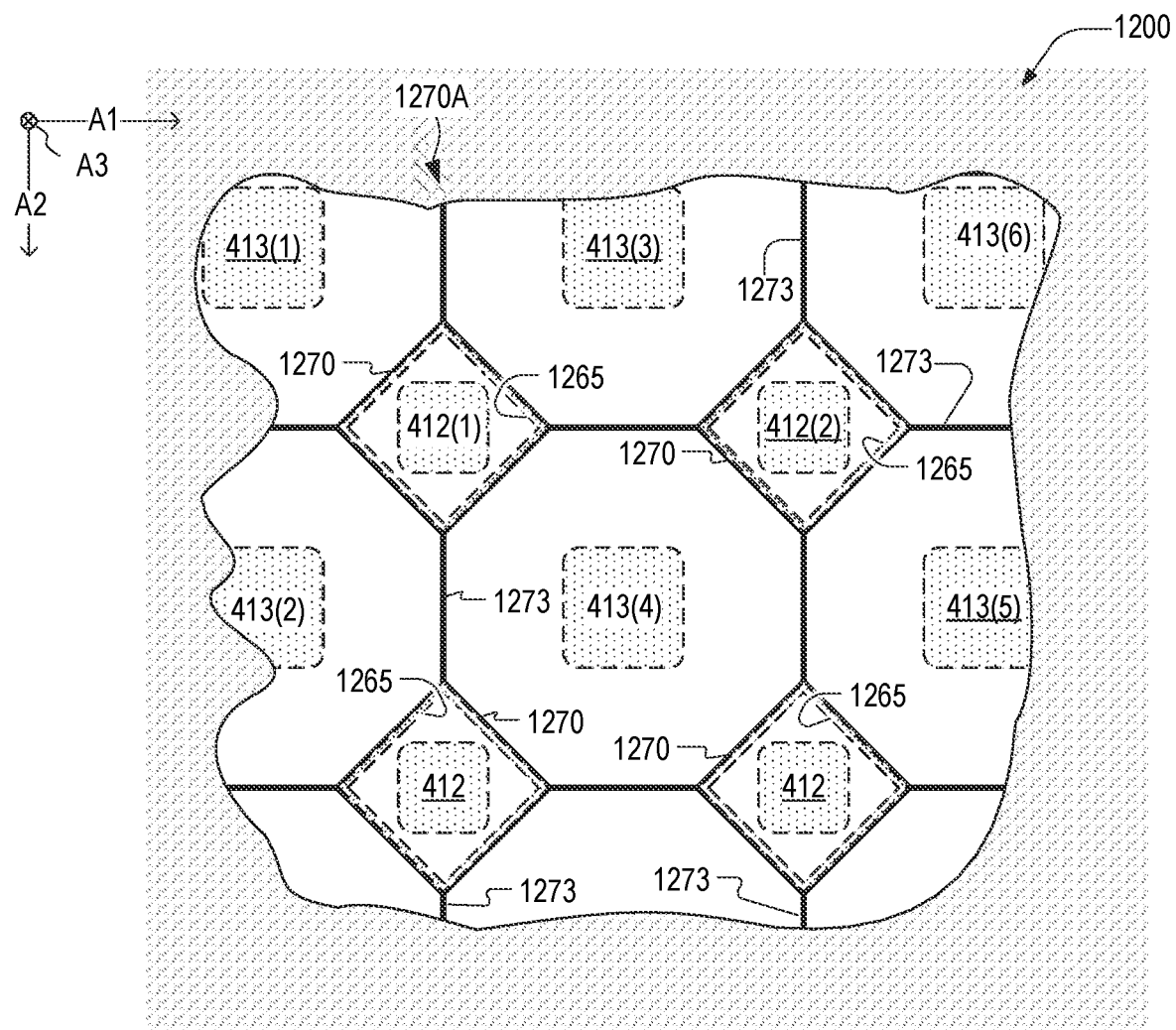
FIG. 12 is a cross-sectional schematic of a pixel-array substrate, which is an embodiment of the pixel-array substrate of FIG. 3.

FIG. 12 is a cross-sectional schematic of a pixel-array substrate 1200, which is an example of pixel-array substrate 300. The cross-section of FIG. 12 is in a cross-sectional plane 12A shown in FIG. 3. Pixel-array substrate 1200 includes a metal grid 1270A formed of a plurality of metal annuluses 1270 and a plurality of interconnecting segments 1273 that connect adjacent annuluses 1270. Examples of metal annulus 1270 include metal annulus 370 and metal annulus 570. In embodiments, metal annuluses 1270 and interconnecting segments 1273 are integrally formed such that metal grid 1270A is monolithic. In embodiments, each interconnecting segment 1273 extends into a respective trench that surrounds a large-photodiode region 413. For clarity of illustration, not all interconnecting segments 1273 are labeled in FIG. 12. In embodiments, pixel-array substrate 1200 includes attenuation layers 1265, which are examples of attenuation layers 365, 565. While photodiode regions 412 and 413 are not in cross-sectional plane 12A, FIG. 12 illustrates them for sake of illustrating the alignment of metal grid 1270A to photodiode regions 412 and 413.

The shape of photodiode regions 412 and 413 although is illustrated as square in FIG. 12, however, in other embodiment photodiode regions 412 and 413 can be shaped conformal to the shape (e.g., diamond-shaped or polygonal shape) defined by the surrounding deep-trench isolation structure and/or surrounding metal annuluses 1270 and interconnecting segments 1273.

Figure 13:
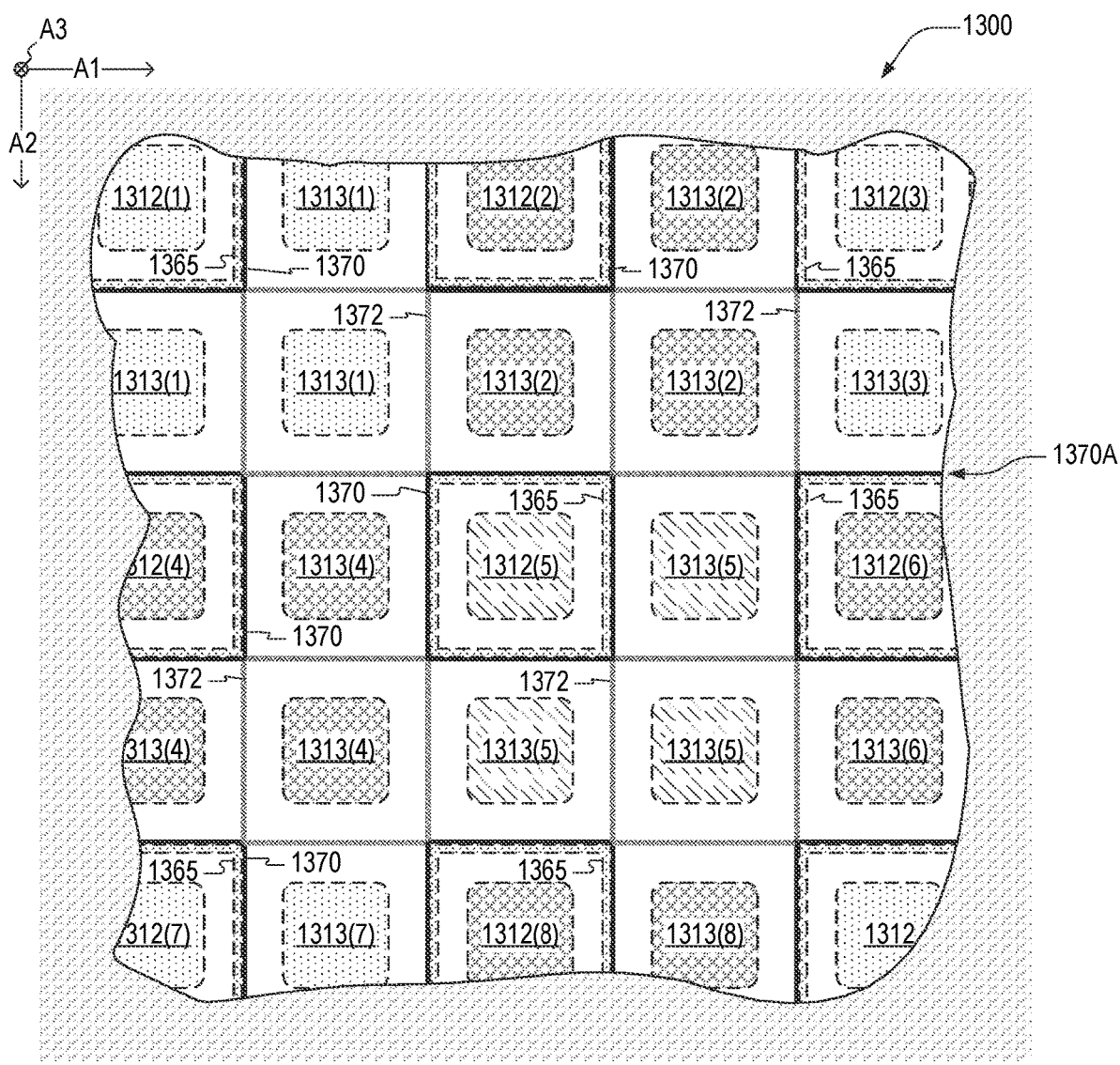
FIG. 13 is a cross-sectional schematic of a pixel-array substrate, which is an embodiment of the pixel-array substrate of FIG. 3.

FIG. 13 is a cross-sectional schematic of a pixel-array substrate 1300, which is an example of pixel-array substrate 300. The cross-section of FIG. 13 is in cross-sectional plane 12A shown in FIG. 3. Pixel-array substrate 1300 includes a plurality of photodiode regions 1312, a plurality of photodiode regions 1313, and a plurality of metal annuluses 1370. Photodiode region 1312, photodiode region 1313, and metal annulus 1370 are respective examples of photodiode region 212, photodiode region 213, and metal annulus 370 or 570. In embodiments, pixel-array substrate 1300 includes additional metal annuluses 1372 each aligned above a respective photodiode region 1313, such that metal annuluses 1370 and 1372 are interconnected to form a metal grid 1370A. In embodiments, pixel-array substrate 1300 includes attenuation layers 1365, which are examples of attenuation layers 365, coated on metal annuluses 1370 and covering the light exposure region of respective photodiode region 1312. While photodiode regions 1312 and 1313 are not in cross-sectional plane 12A, FIG. 13 illustrates them for sake of showing the alignment of each metal annulus 1370 to a respective photodiode region 1312.

Photodiode regions 1312 includes photodiode regions 1312(k), where index k is a positive integer. FIG. 13 illustrates photodiode regions 1312(1-8). Each photodiode region 1312(k) has three photodiode regions 1313(k) adjacent thereto. Two of the three photodiode regions 1313(k) are side-adjacent to photodiode region 1312(k). The remaining photodiode region 1313(k) is corner adjacent to photodiode region 1312(k) and side adjacent to the other two photodiode regions 1313(k). For each index k, photodiode region 1312(k) and three photodiode regions 1313(k) form a two-by-two sub-array.

In embodiments, each photodiode region 1312(k) and three photodiode regions 1313(k) adjacent thereto are beneath a single color filter of a color-filter array. For example, when the color-filter array is a Bayer array, a green color filter is above photodiode regions 1312 and 1313 with index k equal to 2, 4, 6, or 8, a red color filter is above photodiode regions 1312 and 1313 with index k equal to 1, 3, and 7, and a blue color filter is above photodiode regions 1312 and 1313 with index k equal to 5.

Combinations of Features

Features described above as well as those claimed below may be combined in various ways without departing from the scope hereof. The following enumerated examples illustrate some possible, non-limiting combinations.

(A1) A pixel-array substrate includes a semiconductor substrate, a buffer layer, and a metal annulus. The semiconductor substrate includes a first-photodiode region. A back surface of the semiconductor substrate forms a trench surrounding the first-photodiode region in a cross-sectional plane parallel to a first back-surface region of the back surface above the first-photodiode region. The buffer layer is on the back surface and has (i) a thin buffer-layer region located above the first-photodiode region and (ii) a thick buffer-layer region forming an annulus above the trench in a plane parallel to the cross-sectional plane. The metal annulus is on the buffer layer and covers the thick buffer-layer region.

(A2) In embodiments of pixel-array substrate (A1), the metal annulus includes (i) a middle section on the thick buffer-layer region, (ii) an inner section surrounded by the middle section and adhered to both an inner sidewall of the middle section and an inner sidewall of the thick buffer-layer region; and (iii) an outer section adhered to both an outer sidewall of the middle section and an outer sidewall of the thick buffer-layer region.

(A3) In embodiments of pixel-array substrate (A2), a thickness of each of the inner section and the outer section is between twenty nanometers and forty nanometers.

(A4) Embodiments of one of pixel-array substrates (A2) and (A3), further include a dielectric annular layer on a top surface of the middle section.

(A5) In embodiments of pixel-array substrate (A4), (i) the inner section includes an inner top region adhered to an inner surface of the dielectric annular layer and (ii) the outer section includes an outer top region adhered to an outer surface of the dielectric annular layer.

(A6) In embodiments of any of pixel-array substrates (A1)-(A5), a thickness of the thick buffer-layer region is between 0.10 micrometers and 0.16 micrometers.

(A7) In embodiments of any of pixel-array substrates (A1)-(A6), a width of the thick buffer-layer region is between 0.10 micrometers and 0.25 micrometers.

(A8) In embodiments of any of pixel-array substrates (A1)-(A7), a thickness of the thin buffer-layer region being between twenty nanometers and forty nanometers.

(A9) In embodiments of any of pixel-array substrates (A1)-(A8), the buffer layer is formed of an oxide material.

(A10) Embodiments of any of pixel-array substrates (A1)-(A9) further include an adhesion layer between the metal annulus and the thick buffer-layer region.

(A11) In embodiments of pixel-array substrate (A10), the adhesion layer is formed of titanium nitride.

(A12) Embodiments of any of pixel-array substrates (A1)-(A11) further include an attenuation layer on at least one of (i) the thin buffer-layer region, inner sidewalls of the metal annulus, and a top surface of the metal annulus. In embodiments of pixel-array substrate (A12) that include the dielectric annular layer of pixel-array substrate (A4), the attenuation layer may also be on a top surface of the dielectric annular layer.

(A13) In embodiments of pixel-array substrate (A12), the attenuation layer is formed of one of titanium and titanium nitride.

(A14) In embodiments of any of pixel-array substrates (A1)-(A13), the metal annulus being formed of tungsten.

(A15) In embodiments of any of pixel-array substrates (A1)-(A14), the metal annulus has a thickness between 0.1 and 0.3 micrometers.

(A16) Embodiments of any of pixel-array substrates (A1)-(A15), further include a color filter on the thin buffer-layer region. A thickness of the color filter exceeds a thickness of the metal annulus. In embodiments, the color-filter thickness exceeds the metal-annulus thickness by between five nanometers and forty nanometers.

(A17) In embodiments of any of pixel-array substrates (A1)-(A16), the semiconductor substrate further including four second-photodiode regions forming a two-by-two array. In the cross-sectional plane, the first-photodiode region is located within a quadrilateral region defined by respective centers of the four second-photodiode regions.

(A18) In embodiments of pixel-array substrate (A17), (i) the four second-photodiode regions include a first, a second, a third, and a fourth second-photodiode region, the semiconductor substrate further includes an additional first-photodiode region; (ii) the semiconductor substrate further includes a fifth second-photodiode region and a sixth second-photodiode region that, with the third and fourth second-photodiode regions, form an additional two-by-two array; and (iii) in the cross-sectional plane, the additional first-photodiode region is located within a quadrilateral region defined by respective centers of the third, fourth, fifth, and sixth second-photodiode regions.

(A19) In embodiments of either one of pixel-array substrates (A17) and (A18), a pixel-pitch of the two-by-two array is between 0.7 micrometers and 3.0 micrometers, a first width of each first-photodiode region is between 0.7 micrometers and 1.0 micrometers, and a width of each second-photodiode region exceeds the first width.

(A20) In embodiments of any one of pixel-array substrates (A1)-(A19), the semiconductor substrate further includes a second, a third, and a fourth photodiode region. The second photodiode region is side adjacent to a first side of the first-photodiode region. The third photodiode region is side adjacent to a second side of the first-photodiode region. The fourth photodiode region is corner adjacent to the first-photodiode region and side adjacent to each of the second and third photodiode regions.

(B1) A method for fabricating a pixel-array substrate includes (i) forming a metal annulus on a buffer layer disposed on a semiconductor substrate; (ii) decreasing a thickness of buffer-layer regions of the buffer layer not located beneath the metal annulus to yield a thinned buffer layer and; (iii) depositing a conformal metal layer on the thinned buffer layer and the metal annulus.

(B2) Embodiments of method (B1) further includes steps of (i) removing at least part of the conformal metal layer located above a top surface of the metal annulus, and (ii) removing parts of the conformal metal layer located above a photodiode region of the semiconductor substrate.

(B3) Embodiments of one of methods (B1) and (B2) further includes depositing an attenuation layer on (i) parts of the thinned buffer layer located above a photodiode region of the semiconductor substrate and (ii) an inner sidewall of the metal annulus.

Changes may be made in the above methods and systems without departing from the scope of the present embodiments. It should thus be noted that the matter contained in the above description or shown in the accompanying drawings should be interpreted as illustrative and not in a limiting sense. Herein, and unless otherwise indicated the phrase "in embodiments" is equivalent to the phrase "in certain embodiments," and does not refer to all embodiments. The following claims are intended to cover all generic and specific features described herein, as well as all statements of the scope of the present method and system, which, as a matter of language, might be said to fall therebetween.

What is claimed is:

1. A reduced cross-talk pixel-array substrate comprising:
a semiconductor substrate including a first-photodiode region, a back surface of the semiconductor substrate forming a trench surrounding the first-photodiode region in a cross-sectional plane parallel to a first back-surface region of the back surface above the first-photodiode region;
a buffer layer on the back surface and having (i) a thin buffer-layer region located above the first-photodiode region and (ii) a thick buffer-layer region that (a) is thicker than the thin buffer-layer region, and (b) forms an annulus above the trench in a plane parallel to the cross-sectional plane; and
a metal annulus on the buffer layer and covering the thick buffer-layer region.

2. The pixel-array substrate of claim 1, the metal annulus including:
a middle section on the thick buffer-layer region;
an inner section surrounded by the middle section and adhered to both an inner sidewall of the middle section and an inner sidewall of the thick buffer-layer region; and
an outer section adhered to both an outer sidewall of the middle section and an outer sidewall of the thick buffer-layer region.

3. The pixel-array substrate of claim 2, in a direction parallel to the first back-surface region, a thickness of each of the inner section and the outer section being between twenty nanometers and forty nanometers.

4. The pixel-array substrate of claim 2, further comprising a dielectric annular layer on a top surface of the middle section.

5. The pixel-array substrate of claim 4,
the inner section including an inner top region adhered to an inner surface of the dielectric annular layer; and
the outer section including an outer top region adhered to an outer surface of the dielectric annular layer.

6. The pixel-array substrate of claim 4, further comprising an attenuation layer on the thin buffer-layer region, an inner sidewall of the metal annulus, a top surface of the metal annulus, and a top surface of the dielectric annular layer.

7. The pixel-array substrate of claim 1, a thickness of the thick buffer-layer region being between 0.10 micrometers and 0.16 micrometers.

8. The pixel-array substrate of claim 1, a width of the thick buffer-layer region being between 0.10 micrometers and 0.25 micrometers.

9. The pixel-array substrate of claim 1, a thickness of the thin buffer-layer region being between twenty nanometers and forty nanometers.

10. The pixel-array substrate of claim 1, further comprising an adhesion layer between the metal annulus and the thick buffer-layer region.

11. The pixel-array substrate of claim 1, further comprising an attenuation layer on the thin buffer-layer region and on inner sidewalls of the metal annulus.

12. The pixel-array substrate of claim 11, the attenuation layer being formed of one of titanium and titanium nitride.

13. The pixel-array substrate of claim 1, the metal annulus having a thickness between 0.1 and 0.3 micrometers.

14. The pixel-array substrate of claim 1, further comprising a color filter on the thin buffer-layer region and having a thickness that exceeds a thickness of the metal annulus, which, along a direction perpendicular to the first back-surface region, is between the buffer layer and part of the color filter.

15. The pixel-array substrate of claim 1,
the semiconductor substrate further including four second-photodiode regions forming a two-by-two array; and
in the cross-sectional plane, the first-photodiode region being located within a quadrilateral region defined by respective centers of the four second-photodiode regions.

16. The pixel-array substrate of claim 1,
the semiconductor substrate further including a second photodiode region side adjacent to a first side of the first-photodiode region, a third photodiode region side adjacent to a second side of the first-photodiode region, and a fourth photodiode region corner adjacent to the first-photodiode region and side adjacent to each of the second and third photodiode regions.

17. A method for fabricating a pixel-array substrate comprising:
forming a metal annulus on a buffer layer disposed on a semiconductor substrate;
decreasing a thickness of buffer-layer regions of the buffer layer not located beneath the metal annulus to yield a thinned buffer layer; and
depositing a conformal metal layer on the thinned buffer layer and the metal annulus.

18. The method of claim 17, further comprising:
removing at least part of the conformal metal layer located above a top surface of the metal annulus; and
removing parts of the conformal metal layer located above a photodiode region of the semiconductor substrate.

19. The method of claim 17, further comprising depositing an attenuation layer on (i) parts of the thinned buffer layer located above a photodiode region of the semiconductor substrate and (ii) an inner sidewall of the metal annulus.

20. The pixel-array substrate of claim 14, further comprising:
a microlens on the on the color filter,
along the direction perpendicular to the first back-surface region, the metal annulus between the buffer layer and part of the microlens.

* * * * *